US00RE45987E

(19) United States
(12) Reissued Patent
Ogawa

(10) Patent Number: US RE45,987 E
(45) Date of Reissued Patent: Apr. 26, 2016

(54) ELECTRONIC COMPONENT AND METHOD OF MANUFACTURING THE SAME

(71) Applicant: Renesas Electronics Corporation, Kanagawa (JP)

(72) Inventor: Kenta Ogawa, Kanagawa (JP)

(73) Assignee: RENESAS ELECTRONICS COPORATION, Kanagawa (JP)

(21) Appl. No.: 14/015,416

(22) Filed: Aug. 30, 2013

Related U.S. Patent Documents

Reissue of:
(64) Patent No.: 6,884,523
Issued: Apr. 26, 2005
Appl. No.: 10/937,380
Filed: Sep. 10, 2004

(30) Foreign Application Priority Data

Sep. 11, 2003 (JP) ..... 2003-319789

(51) Int. Cl.
*B32B 15/01* (2006.01)
*C25D 5/02* (2006.01)
*C23C 30/00* (2006.01)
(Continued)

(52) U.S. Cl.
CPC ..... *H01L 23/49582* (2013.01); *H01L 24/45* (2013.01); *H01L 24/48* (2013.01); *H01L 2224/29339* (2013.01); *H01L 2224/45144* (2013.01); *H01L 2224/48091* (2013.01); *H01L 2224/48247* (2013.01); *H01L 2224/48639* (2013.01); *H01L 2224/48644* (2013.01); *H01L 2224/85439* (2013.01); *H01L 2224/85444* (2013.01); *H01L 2924/01013* (2013.01); *H01L 2924/01028* (2013.01); *H01L 2924/01078* (2013.01); *H01L 2924/01079* (2013.01); *H01L 2924/19041* (2013.01); *H01L 2924/3025* (2013.01)

(58) Field of Classification Search
None
See application file for complete search history.

(56) References Cited

U.S. PATENT DOCUMENTS

| | | | | |
|---|---|---|---|---|
| 6,811,672 | B2 * | 11/2004 | Matsuo et al. | 205/238 |
| 6,998,036 | B2 | 2/2006 | Dietterle et al. | |
| 2003/0156395 | A1 * | 8/2003 | Ogawa | 361/764 |

FOREIGN PATENT DOCUMENTS

| | | |
|---|---|---|
| JP | 1984-067357 | 4/1984 |
| JP | 1985-238487 | 11/1985 |

(Continued)

OTHER PUBLICATIONS

JP Office Action dated Aug. 4, 2009, with English translation; Application No. 2003-319789.

(Continued)

*Primary Examiner* — Sean E Vincent
(74) *Attorney, Agent, or Firm* — Young & Thompson

(57) ABSTRACT

An external terminal of an electronic component is provided with a lead base material and a metal thin film coating a surface of the lead base material, and an average value of a crystal size index is not less than 7, which is defined based on dimensions of a crystal particle in a direction perpendicular to the lead base material surface and in a direction parallel thereto, taken on a cut surface of the metal thin film defined by a given plane cutting the metal thin film in a direction perpendicular to the lead base material surface. Such constitution provides an electronic component having an external terminal coated with a metal thin film of a simple structure constituted of Sn or a Sn-based and substantially Pb-free alloy, formed by plating on a surface of a lead base material.

59 Claims, 9 Drawing Sheets

(51) Int. Cl.

| | |
|---|---|
| ***H01L 23/50*** | (2006.01) |
| ***H01L 21/60*** | (2006.01) |
| ***H01L 21/02*** | (2006.01) |
| ***H01L 23/48*** | (2006.01) |
| ***H02G 3/08*** | (2006.01) |
| ***H01L 23/495*** | (2006.01) |
| ***H01L 23/00*** | (2006.01) |

(56) References Cited

FOREIGN PATENT DOCUMENTS

| | | |
|---|---|---|
| JP | 2-170996 | 7/1990 |
| JP | 1990-170996 | 7/1990 |
| JP | 1995-157893 | 6/1995 |
| JP | 1998-102283 | 4/1998 |
| JP | 2001-040497 | 2/2001 |
| JP | 2001-040498 | 2/2001 |
| JP | 2001-053210 | 2/2001 |
| JP | 2001-110666 | 4/2001 |
| JP | 2002-124547 | 4/2002 |
| JP | 2002-246208 | 8/2002 |
| JP | 2003-082500 | 3/2003 |
| JP | 2003-105586 | 4/2003 |
| JP | 2003-129276 | 5/2003 |
| JP | 2003-535222 | 11/2003 |

OTHER PUBLICATIONS

R. Kawanaka et al.: "Role of Lead in Growth Supression and Growth Mechanism of Tin Proper Whisker", pp. 148-156; vol. 10, No. 2; 1983, no month given.

* cited by examiner

FIG. 4A
(amended)
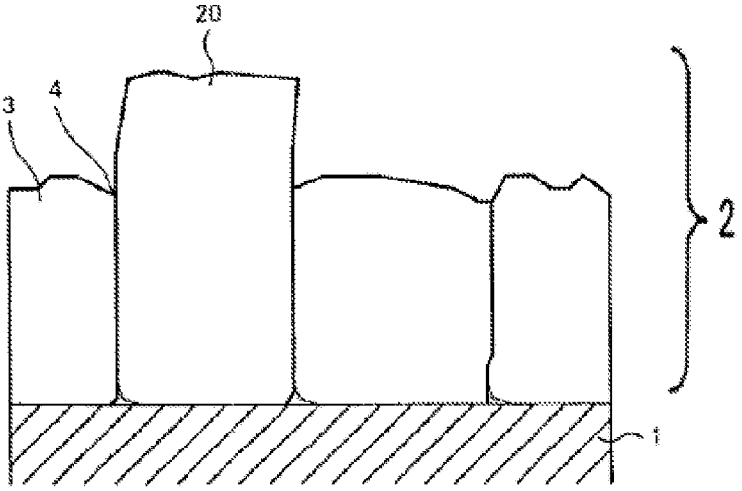

ELECTRONIC COMPONENT AND METHOD OF MANUFACTURING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is based on Japanese patent application. No.2003-319789, the content of which is incorporated hereinto by reference.

BACKGROUND OF THE INVENION

1. Field of the Invention

The present invention relates to an electronic component, and more specifically to an electronic component provided with an external terminal including a lead base material constituted of a predetermined metal material, and a metal thin film coating a surface of the lead base material and including at least a first layer constituted of a material substantially Pb-free and predominantly composed of tin, and to a method of manufacturing such electronic component.

2. Description of the Related Art

When implementing an electronic component such as an integrated circuit (hereinafter abbreviated as "IC"), a transistor, a resistance, a condenser and so forth on a circuit board or the like, an external terminal of the electronic component is electrically connected to a conductive electrode of the circuit board, via a low-melting solder. In this process, the external terminal of the electronic component has to have sufficient solder wettability, so as to secure desired connection reliability between the electronic component and the circuit board. For this purpose, a surface of the lead base material of the external terminal is provided with a metal thin film constituted of Sn or an Sn-based alloy mainly composed of Sn, formed in advance by a surface finishing process such as electrolytic plating.

Referring to the low-melting solder, an Sn—Pb alloy mainly containing tin (hereinafter designated by "Sn") and an additive of lead (hereinafter designated by "Pb") has been popularly used. Here, Sn is the main ingredient of the alloy and serves as an adhesive. Also Pb constitutes, together with Sn, a group of metals that can form a low-melting alloy, and serves to lower a melting point of the alloy and to enhance an adhesion strength thereof. Accordingly, an Sn—Pb alloy has been widely utilized in implementing an electronic component on a circuit board, because of the advantage that a melting point can be easily controlled by adjusting a ratio of those two ingredients, and that these metals are inexpensive.

Referring also to the metal thin film to be formed on a surface of a lead base material of an external terminal included in an electronic component, the metal thin film formed by plating an Sn—Pb alloy has been popularly employed. It is because of the excellent wettability with a low-melting Sn—Pb solder as well as of the inexpensive cost that an Sn—Pb alloy has been preferably employed for plating to form a metal thin film on a surface of a lead base material for an external terminal.

However, the Pb ingredient in the Sn—Pb alloy is harmful against a human body, and besides discarding a used electronic device incurs environmental pollution. Accordingly, Pb is not desirable from an environmental viewpoint. Lately, therefore, a so-called Sn-based and substantially Pb-free alloy, which excludes Pb as an ingredient for constituting a low-melting solder, has come to be popularly used when implementing an electronic component on a circuit board. In correspondence with such trend, on the part of the lead base material of the electronic component also, a Sn-based and substantially Pb (lead) free alloy has come to be widely used for plating a surface thereof, to form a metal thin film.

Here, "substantially Pb-free" means a concentration of Pb of less than 1 wt %, preferably 0.1 wt %. On the other hand, "Pb contained material" contains Pb of 5 to 10 wt %.

When plating a Sn-based and substantially Pb-free alloy on a surface of a lead base material to form a metal thin film, the key issue is maintaining a desired low-melting solder wettabillty and securing desired connection reliability, whichever metal may be adopted as an additive to Sn.

However in case where a Sn-based and substantially Pb-free alloy is plated on a surface of a lead base material to form a metal thin film, a fine metal whisker are prone to appear on a surface of an external terminal under a circumstance of practical use of the electronic component, unlike a case of forming a metal thin film by an Sn—Pb alloy. Such whisker may cause a short circuit between the external terminals, and the tendency becomes higher especially in an electronic component such as an IC in which a multitude of external terminals are led out at fine intervals from a peripheral portion of the package body. Accordingly, restraining emergence of a whisker constitutes a critical issue when forming an outer coating of a metal thin film by plating Sn or a Sn-based and substantially Pb-free alloy on a surface of a lead base material of external terminals disposed in an electronic component.

Referring to this issue, models of whisker emergence mechanism, as well as methods of restraining whisker emergence for the respective models thus far proposed will be described below.

For example, JP-A Laid Open No.2002-246208 refers to a whisker that emerges on an external terminal of a variable resistor. More specifically, the external terminal is provided with a first plated layer consisting of copper (hereinafter designated by "Cu") formed on a surface thereof, and a second plated layer consisting of Sn of 1 to 4 μm in particle diameter, formed on the first plated layer. The cited document states that a whisker emerges after long hours of use of such variable resistor, thereby causing the variable resistor to render an unstable output. FIG. 10 is a schematic cross-sectional view showing a state that a whisker has merged on an external terminal of the variable resistor. According to the JP-A Laid Open No.2002-246208, the external terminal 113 is provided with a metal plate portion 109, the first plated layer 110 consisting of Cu formed thereon, and also the second plated layer 111 consisting of Sn formed on the first plated layer 110. Because of such structure, an oxide layer emerges on a surface of the second plated layer 111 after using the variable resistor for a long time, thereby causing expansion of each particle constituting the second plated layer 111, resulting in emergence of whisker 114 on the external terminal 113, as shown in FIG. 10. And in order to prevent the whisker from emerging in this way on the second plated layer, the JP-A Laid Open No.2002-246208 proposes fusing the plated particles of the second plated layer to transform the particles into a uniform layer, after forming the first plated layer consisting of Cu and the second plated layer consisting of Sn on the external terminal surface. The document states that this process can prevent expansion in volume of the plated particles due to formation of an oxide layer despite a long term use of the variable resistor, and can resultantly restrain the whisker emergence on the second plated layer consisting of Sn formed on the external terminal surface.

Also, JP-A Laid Open No.2001-110666 discloses providing an Sn-plated layer consisting of fine particles not larger than 1 μm in average crystal particle diameter, on an outermost layer of an external electrode consisting of a plurality of layers, formed on a base material surface of an electronic component. More specifically, the external electrode includes a nickel (hereinafter designated by "Ni") plated layer formed on a thick film electrode located in contact with both end portions of a ceramic base material, and an Sn-plated layer being formed on the Ni-plated layer and constituting an outermost layer of the external electrode. The Sn-plated layer is formed by electrolytic plating of Sn, such that an average crystal particle diameter becomes 1 μm or less. Such fine structure can restrain whisker emergence on the Sn-plated layer, even under a circumstance of a temperature cycle alternately repeating a high temperature and a low temperature.

Also, Ryusuke Kawanaka et al., "Role of Lead in growth suppression and growth mechanism of Tin-proper whisker", Japanese Association for Crystal Growth, Vol. 10, No.2, pp. 148-156, Dec. 15, 1983 reports different emergence mechanisms of a whisker.

FIG. 11 is a schematic drawing for explaining a whisker emergence mechanism stated in Ryusuke Kawanaka et al., "Role of Lead in growth suppression and growth mechanism of Tin-proper whisker". Japanese Crystal Growth Society. Vol. 10, No.2, pp. 148-156, Dec. 15, 1983. According to this literature, an oxide layer grows with the lapse of time on a surface of an Sn or an Sn-alloy plated layer formed on a metal surface. Since such oxide layer often has an uneven thickness, an internal stress produced inside the plated layer concentrates in a defective portion of the oxide layer where the layer is thin, and squeezes out inner atoms, thereby causing a whisker to grow.

However, the method of fusing the plated particles in the Sn-plated layer according to the JP-A Laid Open No.2002-246208 includes, for example, placing internal and external terminals in a first furnace provided with an FIR heater for approx. 30 seconds for preheating up to 220 degree centigrade, and passing them through a second heating furnace provided with a burner in approx. one second, for heating up to approx. 900 degree centigrade. Treating at such a high temperature a semiconductor component provided with a resin material, which is less resistant against heat than a metal, at a position close to a terminal incurs heat degeneration of the resin component (melting, carbonization, degradation, oxidation and so on), deterioration of materials of each configuration, mechanical damage by vaporizing expansion of water in the package, irregular growth of the interfacial metal alloy layer to cause degradation in reliability of performance of the component.

Also, the JP-A Laid Open No.2001-110666 proposes forming an Sn-plated layer consisting of fine crystal particles of not larger than 1 μm in average diameter, to thereby restrain whisker emergence under a temperature cycle. However, some data have shown a contradictory result that a whisker is more prone to appear when a crystal particle diameter of the Sn-plated layer is smaller (For example, JP-A Laid Open No.1990-170996).

According to studies on the whisker emergence mechanism so far achieved, including the foregoing JP-A Laid Open No.2002-246208, JP-A Laid Open No.2001-110666. JP-A Laid Open No.1990-170996, and Ryusuke Kawanaka et al., "Role of Lead in growth suppression and growth mechanism of Tin-proper whisker", Japanese Crystal Growth Society, Vol. 10, No.2, pp. 148-156, Dec. 15, 1983, it is generally considered that formation of an interface reaction layer and a surface oxide layer, internal compression stress in a plated layer, recrystallization, defect displacement, unmatched thermal expansion coefficient between a base material and a plated layer, a compression stress generated by a mechanical processing and so forth are promoting factors for the whisker growth. FIG. 10 shows one of the reported models, where upon formation of a thin oxide layer on an Sn-plated surface, an internal stress produced within the Sn-plated layer concentrates in a defective portion of the oxide layer and easily squeezes out inner atoms, thereby permitting a whisker to emerge. Various approaches have been made as stated in the JP-A Laid Open No.2002-246208, JP-A Laid Open No.2001-110666, JP-A Laid Open No.1990-170996, and Ryusuke Kawanaka et al., "Role of Lead in growth suppression and growth mechanism of Tin-proper whisker", Japanese Crystal Growth Society, Vol. 10, No.2, pp. 148-156, Dec. 15, 1983, and yet exact details of the whisker emergence mechanism have not been clarified.

Nevertheless, from the viewpoint of environmental protection, it is necessary to promote the use of a substantially Pb-free material for plating an outer surface of an external terminal of an electronic component. For this purpose, it is essential to restrain the whisker emergence under a circumstance of practical use, effectively and at a low cost.

SUMMARY OF THE INVENTION

As a result of intensive studies to solve the foregoing problem, the inventor has discovered a method of restraining whisker growth, based on newly established findings as described below.

FIGS. 4A and 4B are a schematic cross-sectional drawing and a perspective drawing of a metal thin film 2 respectively, for describing an Sn atom transfer relative to the whisker growth based on the observation by the inventor. Referring to FIG. 4B, an arrow 30 marked on a particle boundary 4 schematically-show the transfer of the Sn atom. Actually the atom transfer is also considered to simultaneously take place inside a crystal particle, however such transfer is not shown because an amount of Sn atom transfer inside the crystal particle is relatively small, especially under a low temperature. Irregular patterns in each crystal illustrated in FIG. 4B stand for unevenness of a surface of the metal thin film 2. Also, since the particle boundary 4 is located under such uneven surface, the particle boundary 4 cannot be identified through the surface of the metal thin film 2 as it is, unless the surface is polished so as to attain a section parallel to a surface of the lead base material 1. Now description will be given hereunder, referring to FIGS. 4A and 4B wherever necessary.

Firstly, samples were prepared which included an external terminal constituted of a lead base material made of a nickel alloy containing 42% of iron (hereinafter designated by "Fe-42% Ni-alloy") or of a metal material mainly containing copper. In the sample an outer surface of the lead base materials was plated with Sn or a Sn-based and substantially Pb-free alloy under different plating conditions, so as to form a metal thin film. These samples were subjected to a temperature cycle test and a high temperature and high humidity test etc. to examine whether or not a whisker would emerge on the metal thin film. Thereafter, the samples on which a whisker 20 has emerged on the metal thin film have been picked up, for close observation of the whisker 20 through a secondary electron microscope. As a result, it has been proven that a pattern appropriate to a coating deposited by plating remains at a tip portion of the whisker 20, and that besides an entirety of the whisker 20 is constituted of a single crystal.

This leads to an assumption that the whisker 20 is not a crystal that has newly emerged after forming the metal thin film 2, but a crystal which one of the crystal particles originally formed in the plating deposition process where the metal thin film 2 has been formed has grown in a specific direction. Accordingly, it has been concluded that a diameter of the whisker 20 has a correlation with a size of a crystal particle 3 that is considered to be the origin of the whisker growth, included in the metal thin film 2.

Also, through the observation of a process of the whisker growth, it has been assumed that Sn atoms constituting the whisker have gathered from an extensive area in the metal thin film 2 to thereby build the whisker, since a void or a variation (reduction) in thickness of the metal thin film is scarcely seen in the proximity of the position where the whisker has grown, despite a large number of Sn atoms have obviously transferred.

Further, based on these findings, it has been concluded that the emergence and growth of the whisker 20 largely depends on a size of the crystal particle 3 constituting the metal thin film 2. More specifically, with respect to an energy for the emergence and growth of the whisker, such assumption has been made that a greater driving energy is required in order that a thicker whisker emerges from a larger crystal particle, and that a thicker whisker grows shorter by an equal amount of driving energy or supply of Sn atoms.

Then the observation was carried out on the assumption that the whisker growth rate is determined by a supply amount of Sn atoms from a surrounding area, and that the transference of Sn atoms takes place according to a diffusion mechanism of Sn. And based on a characteristic of a whisker that it may rather emerge more prominently under a low temperature, an intergranular diffusion, which predominantly takes place under a low temperature, has been focused on. As a result, an assumption has been reached that a metal thin film constituted of larger crystal particles, and having a smaller crystal particle boundary in a unit volume, provides a slower whisker growth rate.

Also, based on the foregoing assumption that a whisker is nothing but one of the crystal particles formed in advance during the plating deposition process, which has grown in a specific direction, it has been concluded that a metal thin film of a amorphous structure, which does not include a crystal particle that can grow as a whisker, can naturally inhibit the whisker emergence.

Further, the prepared samples were classified into two groups in consideration of the foregoing conclusions. A first sample group consisted of a plurality of untested samples extracted out of the lots including the samples on which a whisker has emerged, while a second sample group consisted of a plurality of untested samples extracted out of the lots including the samples on which a whisker has not emerged. As a result of close observation of a metal thin film structure of these two groups, especially focusing on a crystal particle size, the following facts have been proven.

(1) A whisker has not emerged on a sample having large crystal particles in a plane parallel to a lead base material surface, on a metal thin film surface.

(2) A whisker has not emerged either on a sample having smaller crystal particles in a plane parallel to a lead base material surface, on a metal thin film surface, provided that the metal thin film is thicker.

(3) Upon evaluating a size of crystal particles utilizing a crystal size index, the definition of which will be subsequently described, an average crystal size index of the first sample group has proved to be 3 to 6, while that of the second sample group has proved to be 8 to 15.

The present invention has been conceived based on the foregoing findings, as described hereunder.

According to the present invention, there is provided an electronic component comprising an external terminal including a lead base material constituted of a predetermined metal material, and a metal thin film coating a surface of the lead base material, wherein the metal thin film includes at least a first layer constituted of a material substantially Pb-free and predominantly composed of tin, and an average value of a crystal size index is not less than 7, when the crystal size index is defined as (a+b)/2, where a and b respectively represent dimensions in μm of a crystal particle constituting the first layer in a direction perpendicular to the lead base material surface and in a direction parallel thereto, taken on a cut surface of the first layer defined by a given plane cutting the first layer in a direction perpendicular to the lead base material surface.

Also, according to the present invention there is provided an electronic component comprising an external terminal including a lead base material constituted of a predetermined metal material, and a metal thin film coating a surface of the lead base material, wherein the metal thin film includes at least a first layer constituted of a material substantially Pb-free and predominantly composed of tin, and an average value of Xh/Xv is not less than 4, where Xv and Xh respectively represent dimensions of a crystal particle constituting the first layer in a direction perpendicular to the lead base material surface and in a direction parallel thereto, taken on a cut surface of the first layer defined by a given plane cutting the first layer in a direction perpendicular to the lead base material surface.

Also, according to the present invention there is provided an electronic component comprising an external terminal including a lead base material constituted of a predetermined metal material, and a metal thin film coating a surface of the lead base material, wherein the metal thin film includes at least a first layer constituted of a material substantially Pb-free and predominantly composed of tin, and the first layer is formed by plating.

Also, according to the present invention there is provided an electronic component comprising an external terminal including a lead base material constituted of a predetermined metal material, and a metal thin film coating a surface of the lead base material, wherein the metal thin film includes at least a first layer constituted of a material substantially Pb-free and predominantly composed of tin, and the first layer has a amorphous structure.

Such constitution permits providing a sufficiently small crystal particle boundary in a unit volume of the metal thin film, for example by increasing a diameter of the crystal particles constituting the metal thin film, when forming the metal thin film mainly containing Sn on a surface of a lead base material of an external terminal included in an electronic component. Accordingly, transference of Sn atoms, which is the cause of the whisker emergence and growth in the metal thin film, is restrained. Besides, even though a whisker should emerge, a greater amount of Sn atoms per unit length would be necessary for the whisker growth, since the whisker has a large diameter. As a result, the whisker emergence in the metal thin film is restrained, and even though the whisker should emerge, the subsequent whisker growth is restrained so that the whisker can only grow short.

The present invention prevents an accidental short circuit caused by the whisker emergence and growth, thereby permitting high-density implementation of electronic components, further resulting in upgraded reliability of the implemented components.

BRIEF DESCRIPTION OF THE DRAWINGS

FIGS. 4A and 4B are schematic drawings for explaining an Sn atom transference with respect to a whisker growth.

DETAILED DESCRIPTION OF THE INVENTION

Now referring to the accompanying drawings, embodiments of the present invention will be described hereunder.

Figure 1A:
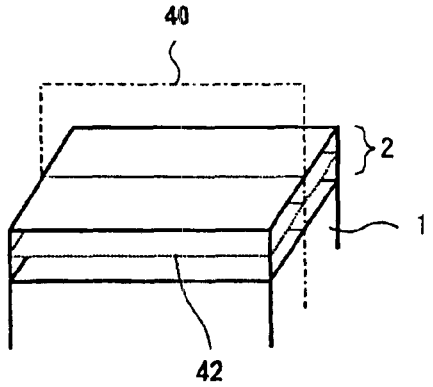
FIGS. 1A to 1C are schematic drawings for explaining the crystal size index defined in the present invention.
Figure 1B:
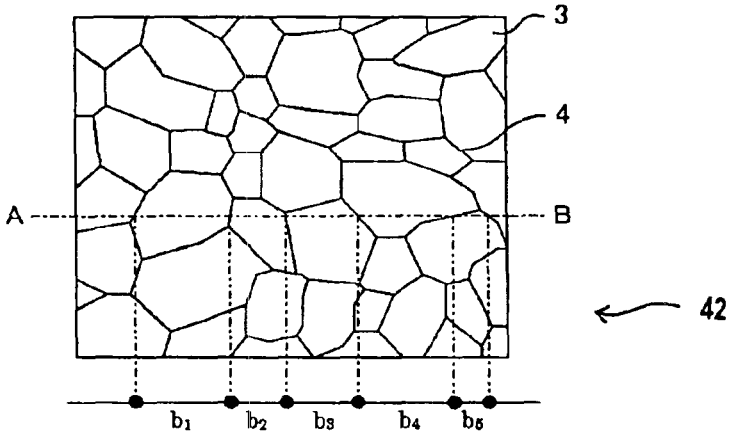
Figure 1C:
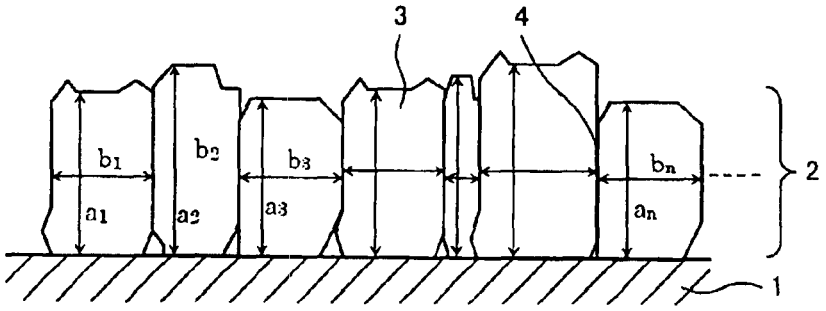

Firstly, the crystal size index will be described as this is one of the principal features of the present invention. Generally, a particle diameter is used to define a size of a crystal particle. However, since a crystal particle is of an irregular three-dimensional shape, it is difficult to measure a size exactly, and besides the interpretation is ambiguous. Accordingly, the inventor has established a definition of the "crystal size index" through an undermentioned process, in order to quantitatively define a size of a crystal particle constituting a metal thin film. FIGS. 1A to 1C are schematic drawings for explaining the crystal size index, showing a lead base material provided with a plated metal thin film on its surface.

The crystal size index is defined as a sum of (a+b) divided by 2, where a and b respectively represent a dimension of a crystal particle in μm in a direction perpendicular to a surface of the lead base material 1 (hereinafter simply referred to as "base material surface") and in directions parallel to the base material surface, taken on a cut surface of the metal thin film 2 defined by a (given) plane 40 cutting the metal thin film 2 in a direction perpendicular to the base material surface. As shown in FIG. 1B, when a given cutting plane 40 perpendicular to the base material surface is passing through, for example, a line A-B on a cutting plane 42 parallel to the base material surface, a dimension of each crystal particle in a direction parallel to the base material surface can be designated as b1 through b5 in this drawing. As is apparent from FIG. 1B, in case where the cutting plane falls on a position distant from a central portion of a crystal particle, a dimension b may be taken as a smaller value than it actually is, as the example of b5. Here, when a direction perpendicular to the base material surface is regarded as a thicknesswise direction of the metal thin film 2, a dimension b in a direction parallel to the base material surface is to be measured in the proximity of a thicknesswise center line of the metal thin film 2. In case where the metal thin film 2 includes a plurality of layers stacked in its thicknesswise direction, a dimension of crystal particles that are located along a thicknesswise center line of the metal thin film 2 is to be measured, though it has been proven through experiments that in most cases columnar crystal particles are aligned forming a single layer as shown in FIG. 1C, when the crystal particles constituting the metal thin film 2 are duly controlled to have a large diameter according to the present invention.

An average crystal size index is to be worked out by first observing and measuring a crystal size index of m pieces (m is an integer not fewer than 2) of crystal particles continuously aligned on a given cut surface, and then dividing a sum of the crystal size index values by m, in other words by calculating an average value of the crystal size index of the crystal particles exposed on the cut-surface. Arithmetically, the average crystal size index is obtained by the following formula, when a crystal size index of an nth crystal particle (n is an integer that satisfies $1 \le n \le m$) is designated by $(a_n+b_n)/2$:

$$\text{AverageCrystalParticleSizeIndex} = \frac{1}{2m}\sum_{n=1}^{m}(a_n + b_n).$$

Now an electronic component according to a first embodiment of the present invention will be described hereunder.

Figure 2A:
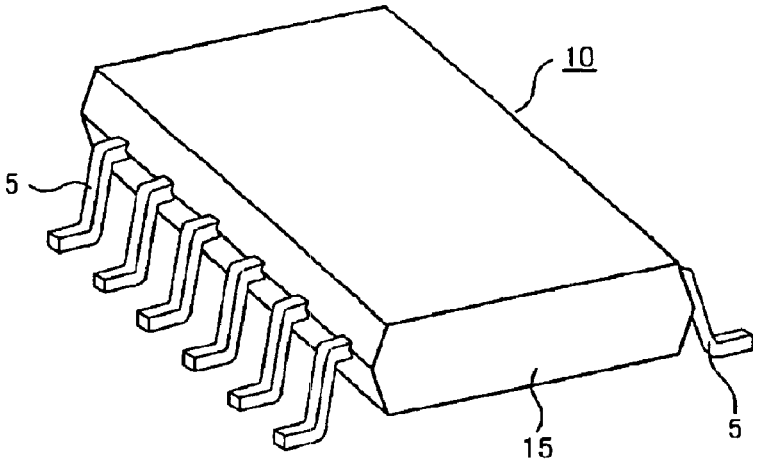
FIGS. 2A and 2B are schematic perspective and plan views, respectively, showing an electronic component according to a first embodiment of the present invention.
Figure 2B:
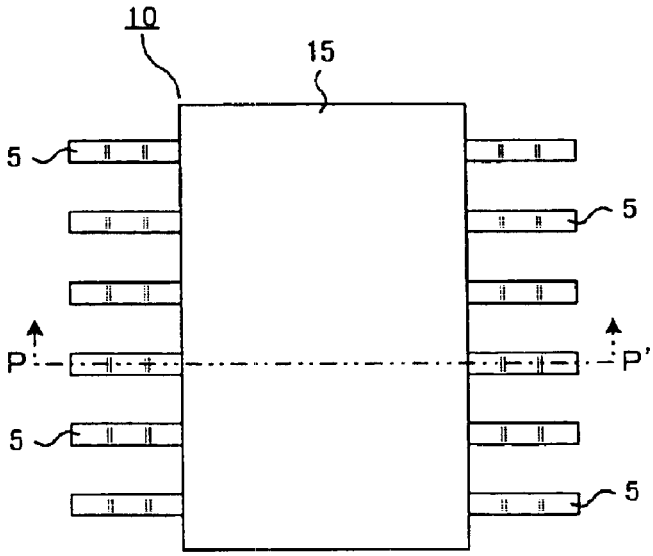
Figure 3A:
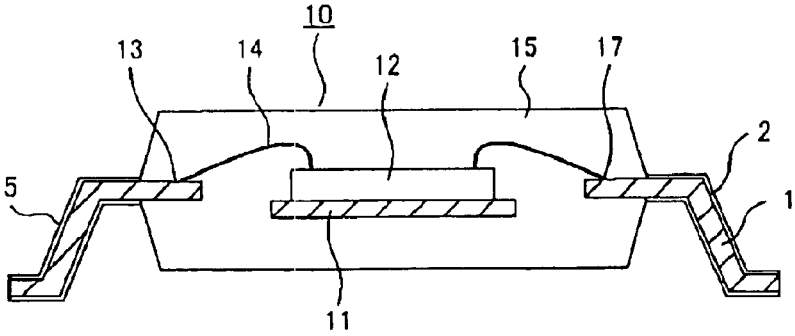
FIG. 3A is a schematic cross-sectional view taken along the line P—P' of FIG. 2B.
Figure 3B:
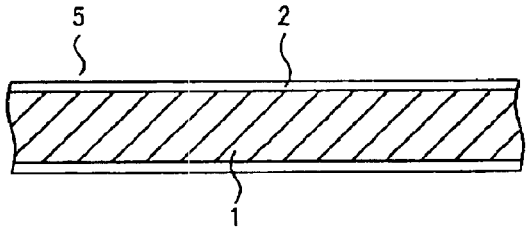
FIG. 3B is an enlarged fragmentary cross-sectional drawing of an external terminal of FIG. 3A.
Figure 4B:
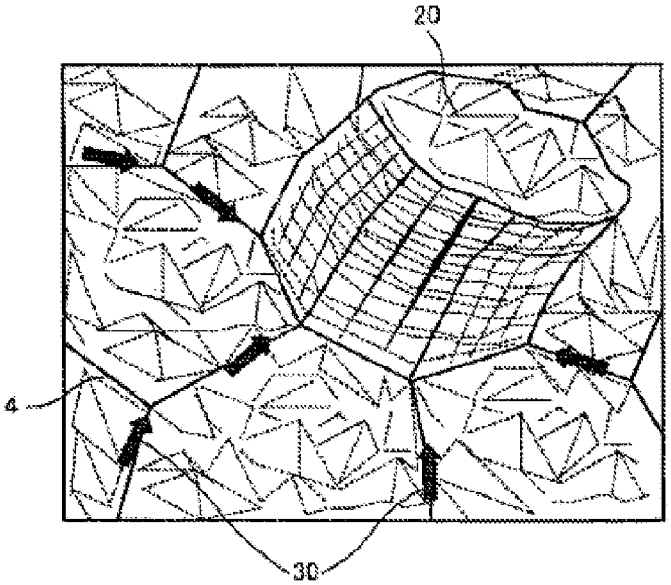

In this embodiment, a resin-sealed (plastic-packaged) integral circuit (referred to "IC") is taken up as an example of the electronic component without limiting thereto, and description will be made on an external terminal of such IC. FIGS. 2A and 2B are schematic perspective and plan views, respectively showing the IC according to this embodiment. FIGS. 3A and 3B serve for more detailed description of the IC, and FIG. 3A is a schematic cross-sectional view taken along the line P—P' of FIG. 2B, while FIG. 3B is an enlarged fragmentary cross-sectional drawing of an external terminal of the IC.

Referring to FIGS. 2A, 2B and 3A, 3B, the IC 10 of this embodiment is provided with a chip mounting pad 11, a semiconductor chip 12 bonded on the chip mounting pad 11 by for example an Ag paste (not shown), a metal fine wire 14 made of an Au wire or the like connecting an electrode (not shown) on the semiconductor chip 12 and an inner lead 13, a sealing resin 15 such as an epoxy resin enclosing the semiconductor chip 12, the chip mounting pad 11, the inner lead 13 and the metal fine wire 14 and so on, and an external terminal 5. Also, the external terminal 5 is provided with a metal thin film 2 including a predetermined first layer, formed on a surface of the lead base material 1 by a surface finishing process such as electrolytic plating. The external terminal 5 and the corresponding inner lead 13 include the lead base material 1 of a one-piece structure, and a surface of the lead base material 1 which corresponds to a region of the inner lead 13 is optionally plated with Ag or Au. Further, the first layer included in the metal thin film 2 of this embodiment is of a structure that achieves an average crystal size index of not less than 7.

According to this embodiment, the external terminal 5 of the IC 10 is provided with the metal thin film 2 which only includes the first layer, formed by plating on a surface of the lead base material 1 constituted of for example an Fe-42% Ni-alloy. The metal thin film 2 of this embodiment is constituted of an Sn—Bi alloy layer predominantly containing Sn with approx. 1.5 wt % of Bi as an additive metal and substantially Pb-free. Practically, an acidic plating solution of a composition as shown in Table 1 was selected for use as a plating bath, among the commercially available acidic plating solutions, and plating was performed with a plating current profile shown in FIG. 5, to thereby form the metal thin film 2 of approx. 12 μm in thickness, constituted of an Sn—Bi alloy layer.

TABLE 1

| Component | Concentration |
|---|---|
| $Sn^{2+}$ | 18 g/L |
| $Bi^{3+}$ | 0.6 g/L |
| Free acid | 1.0N |
| Additive for medium-speed plating | 22 mL/L |

Figure 5:
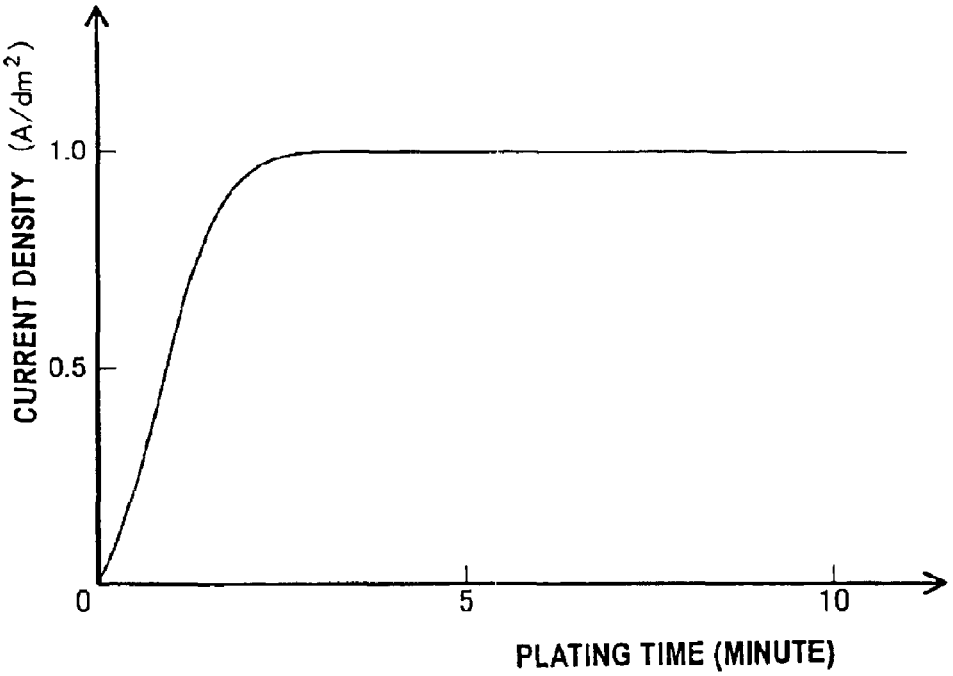
FIG. 5 is a plating current profile according to the first embodiment of the present invention.

Employing a plating current profile as shown in FIG. 5 makes it possible to form large crystal particles in the metal thin film 2 of the IC 10 as in this embodiment. That is, it is preferable to maintain a relatively low plating current density, for example 1 A/dm$^2$ or lower for a predetermined period after initiating plating (here, about 2 min). Then, crystal nucleation may be restrained during the plating process. After duration of the predetermined period, a sufficient plating time should be ensured under a certain current density. An average crystal size index of the metal thin film 2, formed in this way according to this embodiment, has proved to be 11.9.

Also, a greater whisker restraining effect can be achieved by further increasing the crystal particle size through a subsequent heat treatment of a metal thin film constituted of large crystal particles formed according to the first embodiment. Such heat treatment may be performed in two ways; heating at a temperature equal to or lower than a melting point of the metal thin film for a long time so that the crystal particles gradually grow, or once heating to the melting point or higher of the metal thin film and then slowly solidifying the metal thin film.

Figure 6A:
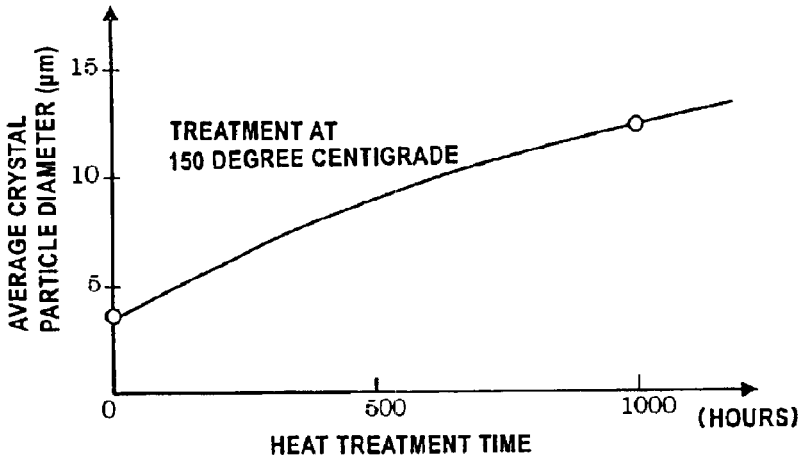
FIGS. 6A and 6B are related to a heat treatment after plating, FIG. 6A showing graphs of a relation between a duration of time and a crystal particle diameter when an Sn-alloy thin film formed by plating is subjected to a temperature of 150 degree centigrade, and FIG. 6B showing a heat treatment profile for once heating a plated metal thin film to its melting point or higher, and slowly solidifying the metal thin film.
Figure 6B:
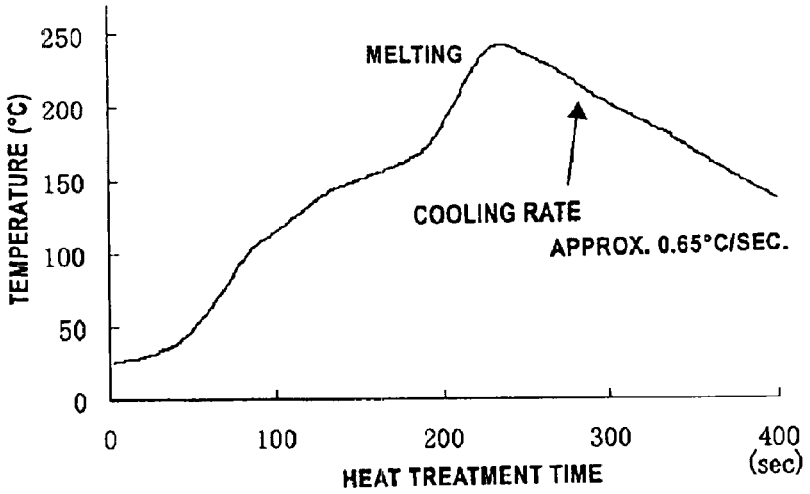

FIG. 6A is a graph showing a relation between a duration of time and a crystal particle diameter when an Sn-alloy thin film formed by plating is subjected to a temperature of 150 degree centigrade. In view of the graph it is understood that the crystal particles gradually grow with the lapse of time. However, such a method as growing the crystal particles over a long time under a melting point or lower of the metal thin film requires at least several tens of hours to grow the crystal particles up to a desired large diameter. Accordingly, From the viewpoint of productivity, it is both practical and preferable to once heat up the metal thin film to its melting point or higher and to slowly solidify the metal thin film, since this method provides a desired effect in a short time. FIG. 6B is a heat treatment profile corresponding to a method of once heating a plated metal thin film to its melting point or higher, and slowly solidifying the metal thin film. In this embodiment, the samples were placed in a belt furnace providing a nitrogen atmosphere, where the temperature was raised to approx. 240 degree centigrade, which is equal to or higher than the melting point of the metal thin film. Then the metal thin film was cooled at a cooling rate of approx. 0.65 degree centigrade per second, at least until the temperature dropped to approx. 140 degree centigrade. Here, in case where the metal thin film is constituted of Sn or an Sn-based alloy, setting the cooling rate at 3 degree centigrade per second at maximum, in a temperature range of 235 to 210 degree centigrade after heating up the metal thin film to its melting point or higher, permits restraining deposition of fine crystal particles. This process permits achieving a better crystal particle growth in particle diameter within 10 minutes or less, than the process of growing the crystal particles over a long time under a melting point or lower of the metal thin film.

Figure 7:
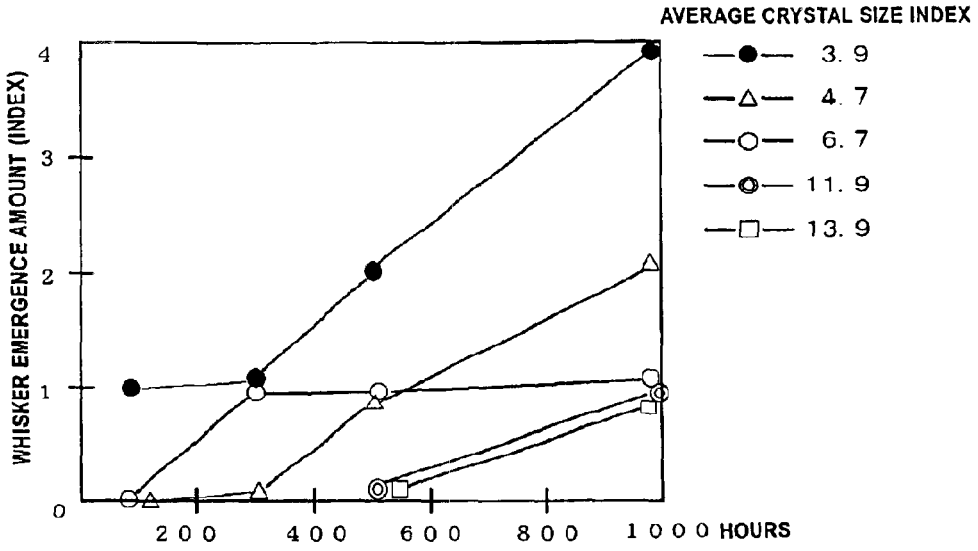
FIG. 7 is a graph showing a whisker emergence status during a high temperature and high humidity test, with respect to an IC according to the first embodiment of the present invention.
Figure 8:
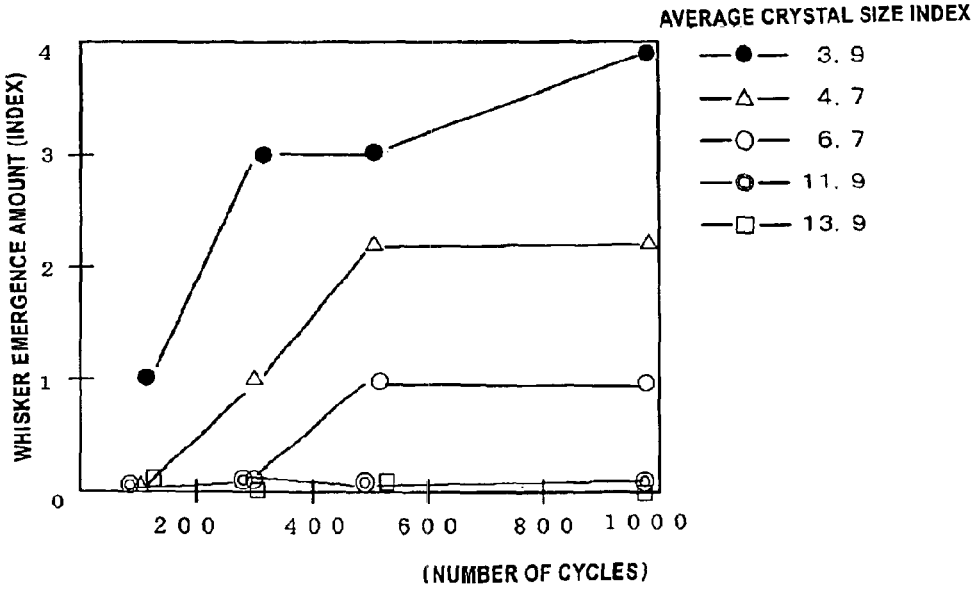
FIG. 8 is a graph showing a whisker emergence status during a temperature cycle test, with respect to an IC according to the first embodiment of the present invention.

Now, a whisker emergence status on the IC 10 of this embodiment, observed during accelerated tests including a high temperature and high humidity test and a temperature cycle test, will be described. FIG. 7 is a graph showing a whisker emergence status during a high temperature and high humidity test (test conditions: atmospheric temperature 85 degree centigrade, relative humidity 85%) with respect to the IC 10 of this embodiment. The horizontal axis of the graph stands for duration of time of maintenance at the high temperature and the high humidity, and the vertical axis a whisker emergence index (the greater the index is, the more whiskers have emerged), thereby showing a whisker emergence amount with the lapse of time. Also, FIG. 8 is a line graph showing a whisker emergence status during a temperature cycle test (test conditions: repetition of 30 minutes under −30 degree centigrade and 30 minutes under 125 degree centigrade), with respect to the IC 10 of this embodiment. The horizontal axis stands for a number of cycles, and the vertical axis a whisker emergence index, thereby showing a whisker emergence amount with the progress of temperature cycles. Also, four types of samples each having a different average crystal size index, all of which are provided with a metal thin film formed by plating, were subjected to the both accelerated tests for comparison purpose. In view of FIGS. 7 and 8, it is apparent that in the both accelerated tests the greater the crystal size index is, the more effectively the whisker emergence is restrained. With respect to a sample provided with a metal thin film including crystal particles of an average crystal size index of 7 or greater as the IC 10 of this embodiment, the whisker emergence index has been suppressed below 1, even after 1000 hours of the high temperature and high humidity test, and 1000 cycles of the temperature cycle test.

Further, this embodiment may be modified such that an average value of Xh/Xv (Xv and Xh are values in the same unit) becomes not less than 4, where Xv and Xh respectively represent dimensions of a crystal particle constituting the first layer in a direction perpendicular to a surface of the lead base material 1 and in a direction parallel thereto, taken on a cut surface of the first layer defined by a given plane cutting the first layer in a direction perpendicular to the surface of the lead base material 1. Alternatively, the metal thin film 2 may be constituted such that a total extended length of the crystal particle boundary of the first layer does not exceed 300 μm per 1000 μm$^2$ of observation area, on a cut surface of the first layer parallel to a surface of the lead base material 1. In case where the first layer has a structure that satisfies either of these conditions, the whisker emergence and growth on the metal thin film 2 can be similarly restrained to the first embodiment.

An electronic component according to a second embodiment of the present invention will now be described hereunder.

Here, a difference of the electronic component of this embodiment from that of the first embodiment only lies in the external terminal, more specifically in a structure of the first layer in the metal thin film of the lead base material surface, and the remaining portions may be the same as the first embodiment. Accordingly, the subsequent description only refers to a structure of the first layer in the metal thin film of this embodiment. The difference from the first embodiment is that the first layer in the metal thin film has a substantially amorphous structure. Forming the first layer in an amorphous structure eliminates the continuous particle boundary, through which the Sn atoms can efficiently transfer. Therefore, even though a whisker emerges, the transference of the Sn atoms necessary for growth of the whisker is restrained, and resultantly the whisker growth is restrained.

Figure 9:
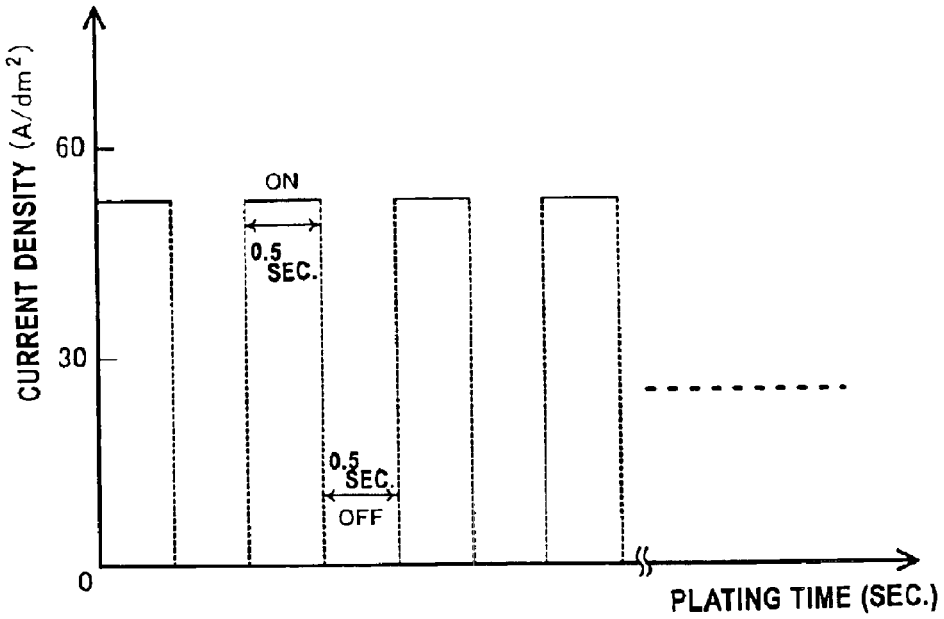
FIG. 9 is a plating current profile according to a second embodiment of the present invention.
Figure 10:
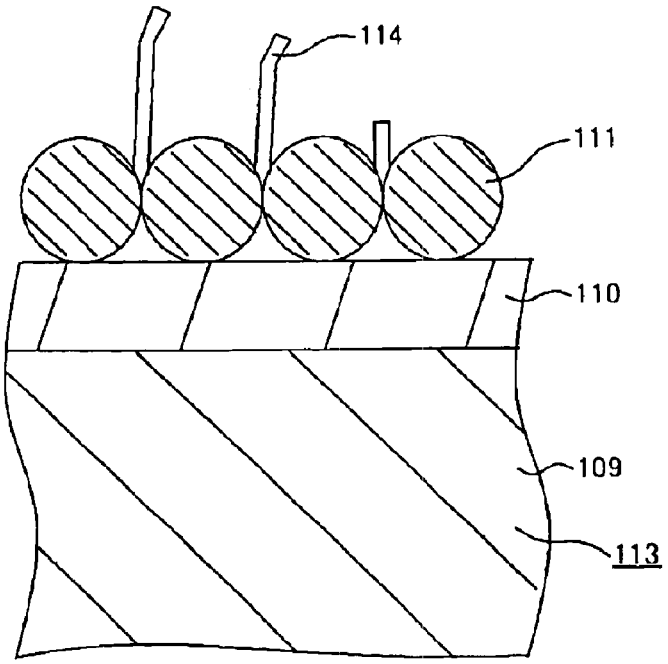
FIG. 10 is a schematic cross-sectional drawing for explaining a whisker emergence mechanism disclosed in JP-A No.2002-246208.
Figure 11:
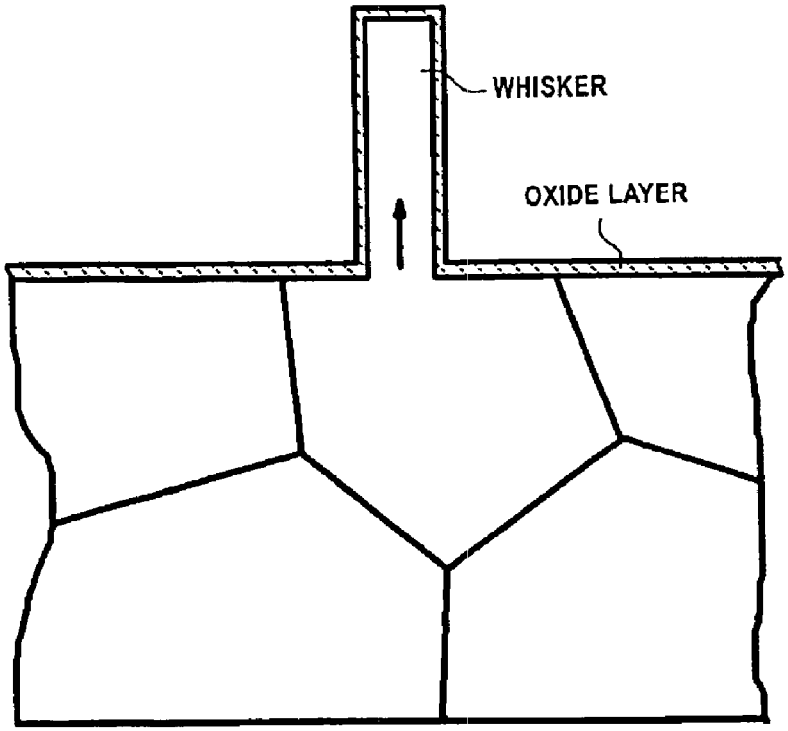
FIG. 11 is a schematic cross-sectional drawing for explaining another whisker emergence mechanism.

A preferable method of forming an amorphous structure in the metal thin film by plating may include preparing a plating solution having a relatively high concentration, setting a sufficient separation between a cathode and an electrode of an object to be plated, applying a high voltage to significantly increase a deposition rate, and further turning the current on and off according to a predetermined profile. FIG. 9 is an example of showing such profile. As shown therein, a current having a high density is supplied, and the current is switched on and off in a short cycle such as every 0.5 second so that growth of each of crystals is suppressed. Since such plating method inhibits the growth of the crystal particles that would constitute the Sn-alloy layer, the Sn-alloy layer is formed in a substantially amorphous structure. Consequently, the Sn-alloy layer does not have a continuous particle boundary, or a crystal particle itself which would serve as a nuclear for a subsequent growth of a whisker. In addition, even in case of forming by plating a metal thin film having such amorphous structure, crystal particles will gradually be formed after plating. However in this case the metal thin film obtains a structure that can restrain a whisker emergence, unlike a structure formed by directly depositing the crystal particles.

Further, a metal thin film having an amorphous structure may also be formed in the following method, in addition to the plating method. Melted Sn or an Sn-alloy may be applied by thermal spraying to an exposed surface of the lead base material so that the Sn or Sn-alloy is rapidly cooled. In this way the lead base material can be coated with the Sn or Sn alloy thin film having an amorphous structure, thereby forming an external terminal provided with the first layer of an amorphous structure. When applying this method to the IC 10 of the foregoing embodiment, the process may preferably include mounting a semiconductor chip on a lead frame, performing a wire bonding, sealing with a resin and applying a heat shielding cover on the resin-sealed portion. Then the thermal spraying may be carried out to apply melted Sn or an Sn-alloy only to an exposed surface of the lead base material so that the Sn or Sn-alloy is rapidly cooled. As a result, the Sn or Sn-alloy thin film coating the lead base material surface obtains an amorphous structure, thereby forming an external terminal provided with the first layer of an amorphous structure. Here also, recrystallization gradually takes place in the first layer formed as above, because of heat to be applied in a subsequent process. However, crystal particles formed by such recrystallization have a different orientation and distribution from those obtained by an ordinary plating method, and the recrystallization does not result in formation of a structure that permits emergence of a whisker.

In addition, referring to a thickness of the first layer, it has been proven that a preferable thickness range is not less than 5 μm and not more than 30 μm, more preferably not less than 10 μm and not more than 25 μm.

It is to be understood that the present invention is not limited to the foregoing embodiments, but that various modifications may be made within the scope and spirit of the present invention. For example, while the above embodiments refer to a metal thin film that only includes the first layer, an underlying plated layer such as a Cu-plated layer, Ni-plated layer, or a zinc (Zn) plated layer may be provided on a surface of the lead base material, so that the first layer may be formed thereon. Alternatively, another layer such as an Au-plated layer, which restrains emergence of a whisker, may further be formed on the first layer.

Also, the first layer may be constituted substantially of pure Sn, or an Sn-based alloy predominantly composed of Sn and containing at least one out of the group consisting of Bi, Ag, Cu, indium (In) and Zn as an additive metal. In case of employing Bi as the additive metal, it is preferable that the first layer includes an Sn—Bi alloy containing not less than 0.5 wt % but not more than 4 wt % of Bi, and that an average crystal size index of such alloy is in a range of not less than 7 but not more than 20. Also, in case of employing Ag as the additive metal, it is preferable that the first layer includes an Sn—Ag alloy containing not less than 0.5 wt % but not more than 6 wt % of Ag, and that an average crystal size index of such alloy is in a range of not less than 7 but not more than 20. Further, in case of employing Cu as the additive metal, it is preferable that the first layer includes an Sn—Cu alloy containing not more than 3 wt % of Cu, and that an average crystal size index of such alloy is in a range of not less than 10 but not more than 30.

Furthermore, while an Fe-42% Ni-alloy is adopted as the material of the lead base material 1 in the foregoing embodiments, an Fe-based alloy, Cu, or a Cu-based alloy predominantly containing Cu may be employed instead.

As described above, the present invention provides an electronic component having an external terminal coated with a metal thin film of a simple structure constituted of Sn or a Sn-based and substantially Pb-free alloy, formed by plating on a surface of a lead base material. Yet such electronic component can effectively restrain emergence of a whisker on the outer plated layer under a circumstance of practical use.

What is claimed is:

1. An electronic component comprising an external terminal including a lead base material constituted of a predetermined metal material, and a metal thin film coating a surface of said lead base material and including at least a first layer constituted of a material substantially Pb-free and predominantly composed of tin, wherein an average value of a crystal size index is not less than 7 when said crystal size index is defined as (a+b)/2, where a and b respectively represent dimensions in μm of a crystal particle constituting said first layer in a direction perpendicular to said lead base material surface and in a direction parallel thereto, taken on a cut surface of said first layer defined by a given plane cutting said first layer in a direction perpendicular to said lead base material surface.

2. The electronic component as recited in claim 1, wherein said first layer is constituted substantially of pure tin, or a tin-based alloy predominantly composed of tin and containing as an additive metal at least one out of the group consisting of bismuth, silver, copper, indium and zinc.

3. An electronic component comprising an external terminal including a lead base material constituted of a predetermined metal material, and a metal thin film coating a surface of said lead base material and including at least a first layer constituted of a material substantially Pb-free and predominantly composed of tin, wherein an average value of Xh/Xv is not less than 4, where Xv and Xh respectively represent dimensions of a crystal particle constituting said first layer in a direction perpendicular to said lead base material surface and in a direction parallel thereto, taken on a cut surface of said first layer defined by a given plane cutting said first layer in a direction perpendicular to said lead base material surface.

4. The electronic component as recited in claim 3, wherein said first layer is constituted substantially of pure tin, or a tin-based alloy predominantly composed of tin and containing as an additive metal at least one out of the group consisting of bismuth, silver, copper, indium and zinc.

5. An electronic component comprising an external terminal including a lead base material constituted of a predetermined metal material, and a metal thin film coating a surface of said lead base material and including at least a first layer constituted of a material substantially Pb-free and predominantly composed of tin, wherein said first layer is formed by plating, and a total extended length of a crystal particle boundary of said first layer is not more than 300 μm per 1000 $\mu m^2$ of observation area, on a cut surface parallel to a surface of said lead base material.

6. The electronic component as recited in claim 5, wherein said first layer is constituted substantially of pure tin, or a tin-based alloy predominantly composed of tin and containing as an additive metal at least one out of the group consisting of bismuth, silver, copper, indium and zinc.

7. An electronic component comprising an external terminal including a lead base material constituted of a predetermined metal material, and a metal thin film coating a surface of said lead base material and including at least a first layer constituted of a material substantially Pb-free and predominantly composed of tin, wherein said first layer in said metal thin film has an amorphous structure.

8. The electronic component as recited in claim 7, wherein said first layer is constituted substantially of pure tin, or a tin-based alloy predominantly composed of tin and containing as an additive metal at least one out of the group consisting of bismuth, silver, copper, indium and zinc.

9. The electronic component as recited in claim 1, wherein said first layer is constituted substantially of pure tin, and an average crystal size index of said first layer is in a range of 7 to 20.

10. The electronic component as recited in claim 1, wherein said first layer includes a tin-bismuth alloy predominantly composed of tin and containing not less than 0.5 wt % but not more than 4 wt % of bismuth, and an average crystal size index of said first layer is in a range of 7 to 20.

11. The electronic component as recited in claim 1, wherein said first layer includes a tin-silver alloy containing not less than 0.5 wt % but not more than 6 wt % of silver, and an average crystal size index of said first layer is in a range of 7 to 20.

12. The electronic component as recited in claim 1, wherein said first layer includes a tin-copper alloy containing not more than 3 wt % of copper, and an average crystal size index of said first layer is in a range of 10 to 30.

13. The electronic component as recited in claim 1, wherein said metal material is either a metal predominantly composed of copper, or an iron-nickel alloy.

[14. A method of manufacturing an electronic component comprising an external terminal, including a lead base material constituted of a predetermined metal material and a metal thin film coating a surface of said lead base material, said metal thin film including at least a first layer constituted of a material substantially Pb-free and predominantly composed of tin, said first layer being formed by an electrolytic plating process, wherein said electrolytic plating process for forming said first layer includes an initial plating step of supplying a current having a current density not greater than 1 $A/dm^2$ during an initial stage of a predetermined duration of time.]

[15. The method as recited in claim 14, further comprising a heat treatment step of heating said first layer at a predetermined temperature for a predetermined time after said plating process, wherein said predetermined temperature in said heat treatment step is not more than a melting point of said first layer.]

[16. The method as recited in claim 14, further comprising a heat treatment step of heating said first layer at a predetermined temperature for a predetermined time after said plating process, wherein said heat treatment step includes melting step of heating said first layer at a temperature equal to or higher than a melting point thereof for a predetermined time and gradual cooling step of gradually cooling said first layer after said melting step, and wherein a cooling rate in said gradual cooling step is not more than 3 degree centigrade per second.]

*17. An electronic component comprising an external terminal including a lead base material constituted of a predetermined metal material, and a metal thin film coating a surface of said lead base material and including a first layer constituted of a material substantially Pb-free and predominantly composed of tin,*

*wherein an average value of a crystal size index is not less than 7 when said crystal size index is defined as (a+b)/2, where a and b respectively represent dimensions in μm of a crystal particle constituting said first layer in a direction perpendicular to said lead base material surface and in a direction parallel thereto, taken on a cut surface of said first layer defined by a given plane cutting said first layer in a direction perpendicular to said lead base material surface, and*

*wherein said first layer is composed of a plurality of crystal particles arranged in a single layer on said surface of said lead base material.*

*18. An electronic component comprising an external terminal including a lead base material constituted of a predetermined metal material, and a metal thin film coating a surface of said lead base material and including a first layer constituted of a material substantially Pb-free and predominantly composed of tin,*

*wherein an average value of Xh/Xv is not less than 4, where Xv and Xh respectively represent dimensions of a crystal particle constituting said first layer in a direction perpendicular to said lead base material surface and in a direction parallel thereto, taken on a cut surface of said first layer defined by a given plane cutting said first layer in a direction perpendicular to said lead base material surface, and*

*wherein said first layer is composed of a plurality of the crystal particle arranged in a single layer on said surface of said lead base material.*

*19. An electronic component comprising an external terminal including a lead base material constituted of a predetermined metal material, and a metal thin film coating a surface of said lead base material and including a first layer constituted of a material substantially Pb-free and predominantly composed of tin,*

*wherein said first layer is formed by plating, and a total extended length of a crystal particle boundary of said first layer is not more than 300 μm per 1000 $\mu m^2$ of observation area, on a cut surface parallel to a surface of said lead base material, and*

*wherein said first layer is composed of a crystal particle arranged in a single layer on said surface of said lead base material.*

*20. A method of manufacturing an electronic component comprising an external terminal, including a lead base material constituted of a predetermined metal material and a metal thin film coating a surface of said lead base material, said metal thin film including a first layer constituted of a material substantially Pb-free and predominantly composed of tin, said first layer being composed of a plurality of crystal particles arranged in a single layer on said surface of said lead base material, and said first layer being formed by an electrolytic plating process,*

*wherein said electrolytic plating process for forming said first layer includes an initial plating step of supplying a current having a current density not greater than 1 A/dm$^2$ during an initial stage of a predetermined duration of time.*

*21. An electronic component comprising an external terminal including a lead base material constituted of a predetermined metal material, and a metal thin film coating a surface of said lead base material and including a first layer constituted of a material substantially Pb-free and predominantly composed of tin,*

*wherein said lead base material comprises a plated layer underlying said first layer on which said first layer is formed, and*

*wherein an average value of a crystal size index is not less than 7 when said crystal size index is defined as (a+b)/2, where a and b respectively represent dimensions in μm of a crystal particle constituting said first layer in a direction perpendicular to said lead base material surface and in a direction parallel thereto, taken on a cut surface of said first layer defined by a given plane cutting said first layer in a direction perpendicular to said lead base material surface.*

*22. An electronic component comprising an external terminal including a lead base material constituted of a predetermined metal material, and a metal thin film coating a surface of said lead base material and including a first layer constituted of a material substantially Pb-free and predominantly composed of tin,*

*wherein said lead base material comprises a plated layer underlying said first layer on which said first layer is formed, and*

*wherein an average value of Xh/Xv is not less than 4, where Xv and Xh respectively represent dimensions of a crystal particle constituting said first layer in a direction perpendicular to said lead base material surface and in a direction parallel thereto, taken on a cut surface of said first layer defined by a given plane cutting said first layer in a direction perpendicular to said lead base material surface.*

*23. An electronic component comprising an external terminal including a lead base material constituted of a predetermined metal material, and a metal thin film coating a surface of said lead base material and including a first layer constituted of a material substantially Pb-free and predominantly composed of tin,*

*wherein said lead base material comprises a plated layer underlying said first layer on which said first layer is formed, and*

*wherein said first layer is formed by plating, and a total extended length of a crystal particle boundary of said first layer is not more than 300 μm per 1000 μm$^2$ of observation area, on a cut surface parallel to a surface of said lead base material.*

*24. An electronic component comprising an external terminal including a lead base material constituted of a predetermined metal material, and a metal thin film coating a surface of said lead base material and including a first layer constituted of a material substantially Pb-free and predominantly composed of tin,*

*wherein said lead base material comprises a plated layer underlying said first layer on which said first layer is formed, and*

*wherein said first layer in said metal thin film has an amorphous structure.*

*25. A method of manufacturing an electronic component comprising an external terminal, including a lead base material constituted of a predetermined metal material and a metal thin film coating a surface of said lead base material, said metal thin film including a first layer constituted of a material substantially Pb-free and predominantly composed of tin, said first layer being composed of a plurality of crystal particles arranged in a single layer on said surface of said lead base material, and said first layer being formed by an electrolytic plating process,*

*wherein said lead base material comprises a plated layer underlying said first layer on which said first layer is formed, and*

*wherein said electrolytic plating process for forming said first layer includes an initial plating step of supplying a current having a current density not greater than 1 A/dm$^2$ during an initial stage of a predetermined duration of time.*

*26. An electronic component comprising an external terminal including a lead base material constituted of a predetermined metal material, and a metal thin film coating a surface of said lead base material, said metal thin film being composed only of a first layer constituted of a material substantially Pb-free and predominantly composed of tin,*

*wherein an average value of a crystal size index is not less than 7 when said crystal size index is defined as (a+b)/2, where a and b respectively represent dimensions in μm of a crystal particle constituting said first layer in a direction perpendicular to said lead base material surface and in a direction parallel thereto, taken on a cut surface of said first layer defined by a given plane cutting said first layer in a direction perpendicular to said lead base material surface.*

*27. An electronic component comprising an external terminal including a lead base material constituted of a predetermined metal material, and a metal thin film coating a surface of said lead base material, said metal thin film being composed only of a first layer constituted of a material substantially Pb-free and predominantly composed of tin,*

*wherein an average value of Xh/Xv is not less than 4, where Xv and Xh respectively represent dimensions of a crystal particle constituting said first layer in a direction perpendicular to said lead base material surface and in a direction parallel thereto, taken on a cut surface of said first layer defined by a given plane cutting said first layer in a direction perpendicular to said lead base material surface.*

*28. An electronic component comprising an external terminal including a lead base material constituted of a predetermined metal material, and a metal thin film coating a surface of said lead base material, said metal thin film being composed only of a first layer constituted of a material substantially Pb-free and predominantly composed of tin,*

*wherein said first layer is formed by plating, and a total extended length of a crystal particle boundary of said*

*first layer is not more than 300 μm per 1000 μm² of observation area, on a cut surface parallel to a surface of said lead base material.*

*29. An electronic component comprising an external terminal including a lead base material constituted of a predetermined metal material, and a metal thin film coating a surface of said lead base material, said metal thin film being composed only of a first layer constituted of a material substantially Pb-free and predominantly composed of tin,*

*wherein said first layer in said metal thin film has an amorphous structure.*

*30. A method of manufacturing an electronic component comprising an external terminal, including a lead base material constituted of a predetermined metal material and a metal thin film coating a surface of said lead base material, said metal thin film being composed only of a first layer constituted of a material substantially Pb-free and predominantly composed of tin, said first layer being composed of a plurality of crystal particles arranged in a single layer on said surface of said lead base material, and said first layer being formed by an electrolytic plating process,*

*wherein said electrolytic plating process for forming said first layer includes an initial plating step of supplying a current having a current density not greater than 1 A/dm² during an initial stage of a predetermined duration of time.*

*31. An electronic component comprising an external terminal including a lead base material constituted of a predetermined metal material, and a metal thin film coating a surface of said lead base material and including a first layer constituted of a material substantially Pb-free and predominantly composed of tin,*

*wherein an average value of a crystal size index is not less than 7 when said crystal size index is defined as (a+b)/2, where a and b respectively represent dimensions in μm of a crystal particle constituting said first layer in a direction perpendicular to said lead base material surface and in a direction parallel thereto, taken on a cut surface of said first layer defined by a given plane cutting said first layer in a direction perpendicular to said lead base material surface,*

*wherein said crystal particle is comprised of a columnar structure, and*

*wherein said first layer is composed of a plurality of columnar crystal particles arranged in a single layer on said surface of said lead base material.*

*32. An electronic component comprising an external terminal including a lead base material constituted of a predetermined metal material, and a metal thin film coating a surface of said lead base material and including a first layer constituted of a material substantially Pb-free and predominantly composed of tin,*

*wherein an average value of Xh/Xv is not less than 4, where Xv and Xh respectively represent dimensions of a crystal particle constituting said first layer in a direction perpendicular to said lead base material surface and in a direction parallel thereto, taken on a cut surface of said first layer defined by a given plane cutting said first layer in a direction perpendicular to said lead base material surface,*

*wherein said crystal particle is comprised of a columnar structure, and*

*wherein said first layer is composed of a plurality of columnar crystal particles arranged in a single layer on said surface of said lead base material.*

*33. An electronic component comprising an external terminal including a lead base material constituted of a predetermined metal material, and a metal thin film coating a surface of said lead base material and including a first layer constituted of a material substantially Pb-free and predominantly composed of tin,*

*wherein said first layer is formed by plating, and a total extended length of a crystal particle boundary of said first layer is not more than 300 μm per 1000 μm² of observation area, on a cut surface parallel to a surface of said lead base material, and*

*wherein said first layer is composed of a plurality of columnar crystal particles arranged in a single layer on said surface of said lead base material.*

*34. A method of manufacturing an electronic component comprising an external terminal, including a lead base material constituted of a predetermined metal material and a metal thin film coating a surface of said lead base material, said metal thin film including a first layer constituted of a material substantially Pb-free and predominantly composed of tin, said first layer being composed of a plurality of columnar crystal particles arranged in a single layer on said surface of said lead base material, and said first layer being formed by an electrolytic plating process,*

*wherein said electrolytic plating process for forming said first layer includes an initial plating step of supplying a current having a current density not greater than 1 A/dm² during an initial stage of a predetermined duration of time.*

*35. An electronic component, comprising:*

*an external terminal including a lead base material constituted of a predetermined metal material, and a metal thin film covering a surface of said lead base material,*

*wherein said metal thin film has a first layer made of a material substantially Pb-free;*

*wherein said first layer is made of a material predominantly composed of tin;*

*wherein an average value of a crystal size index of a crystal particle constituting said first layer is greater than or equal to 7 μm,*

*wherein said crystal size index defines a value obtained by dividing a sum of a size in a first direction and a size in a second direction by 2, in said crystal particle seen in a cross section of said first layer;*

*wherein said cross section of said first layer is a given surface cutting said first layer in said first direction;*

*wherein said first direction is a direction, which is perpendicular to said surface of said lead base material; and*

*wherein said second direction is a direction, which is parallel to said surface of said lead base material.*

*36. An electronic component, comprising:*

*an external terminal including a lead base material constituted of a predetermined metal material, and a metal thin film covering a surface of said lead base material,*

*wherein said metal thin film has a first layer made of a material substantially Pb-free;*

*wherein said first layer is made of a material predominantly composed of tin;*

*wherein an average value of Xh/Xv of a crystal particle constituting said first layer is greater than or equal to 4,*

*wherein Xv is a size in a first direction perpendicular to said surface of said lead base material, in said crystal particle seen in a cross section of said first layer;*

*wherein Xh is a size in a second direction parallel to said surface of said lead base material, in said crystal particle seen in said cross section of said first layer; and*

*wherein said cross section of said first layer is a given surface cutting said first layer in said first direction.*

37. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin;

wherein said first layer is formed by plating;

wherein a total extended length of a crystal particle boundary of said first layer is less than or equal to 300 μm per 1000 $\mu m^2$ of observation area; and wherein said observation area is a cut surface parallel to said surface of said lead base material.

38. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin; and wherein said first layer in said metal thin film has an amorphous structure.

39. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin;

wherein an average value of a crystal size index of a crystal particle constituting said first layer is greater than or equal to 7 μm, wherein said crystal size index defines a value obtained by dividing a sum of a size in a first direction and a size in a second direction by 2, in said crystal particle seen in a cross section of said first layer;

wherein said cross section of said first layer is a given surface cutting said first layer in said first direction;

wherein said first direction is a direction, which is perpendicular to said surface of said lead base material;

wherein said second direction is a direction, which is parallel to said surface of said lead base material; and wherein said first layer is composed of a plurality of crystal particles arranged in a single layer on said surface of said lead base material.

40. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin;

wherein an average value of Xh/Xv of a crystal particle constituting said first layer is greater than or equal to 4, wherein Xv is a size in a first direction perpendicular to said surface of said lead base material, in said crystal particle seen in a cross section of said first layer;

wherein Xh is a size in a second direction parallel to said surface of said lead base material, in said crystal particle seen in said cross section of said first layer;

wherein said cross section of said first layer is a given surface cutting said first layer in said first direction; and wherein said first layer is composed of a plurality of crystal particles arranged in a single layer on said surface of said lead base material.

41. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin;

wherein said first layer is formed by plating;

wherein a total extended length of a crystal particle boundary of said first layer is less than or equal to 300 μm per 1000 $\mu m^2$ of observation area;

wherein said observation area is a cut surface parallel to said surface of said lead base material; and wherein said first layer is composed of a plurality of crystal particles arranged in a single layer on said surface of said lead base material.

42. A method of manufacturing an electronic component comprising an external terminal, including a lead base material constituted of a predetermined metal material and a metal thin film covering a surface of said lead base material, said metal thin film having a first layer made of a material substantially Pb-free and made of a material predominantly composed of tin, said first layer is composed of a plurality of crystal particles arranged in a single layer on said surface of said lead base material, and said first layer being formed by an electrolytic plating process, wherein said electrolytic plating process for forming said first layer includes an initial plating step of supplying a current having a current density less than or equal to 1 $A/dm^2$ during an initial stage of a predetermined duration of time.

43. An electronic component, comprising:

an external terminal including a lead base material constituted of a predetermined metal material, and a metal thin film covering a surface of said lead base material, wherein said metal thin film has a first layer made of a material substantially Pb-free;

wherein said first layer is made of a material predominantly composed of tin;

wherein an average value of a crystal size index of a crystal particle constituting said first layer is greater than or equal to 7 μm, wherein said crystal size index defines a value obtained by dividing a sum of a size in a first direction and a size in a second direction by 2, in said crystal particle seen in a cross section of said first layer;

wherein said cross section of said first layer is a given surface cutting said first layer in said first direction;

wherein said first direction is a direction, which is perpendicular to said surface of said lead base material;

wherein said second direction is a direction, which is parallel to said surface of said lead base material;

wherein said first layer is composed of a plurality of crystal particles arranged in a single layer on said surface of said lead base material; and wherein said first layer is the uppermost layer to be contacted with a solder.

44. An electronic component, comprising:

an external terminal including a lead base material constituted of a predetermined metal material, and a metal thin film covering a surface of said lead base material, wherein said metal thin film has a first layer made of a material substantially Pb-free;

*wherein said first layer is made of a material predominantly composed of tin;*

*wherein an average value of Xh/Xv of a crystal particle constituting said first layer is greater than or equal to 4,*

*wherein Xv is a size in a first direction perpendicular to said surface of said lead base material, in said crystal particle seen in a cross section of said first layer;*

*wherein Xh is a size in a second direction parallel to said surface of said lead base material, in said crystal particle seen in said cross section of said first layer;*

*wherein said cross section of said first layer is a given surface cutting said first layer in said first direction;*

*wherein said first layer is composed of a plurality of crystal particles arranged in a single layer on said surface of said lead base material; and*

*wherein said first layer is the uppermost layer to be contacted with a solder.*

*45. An electronic component, comprising:*

*an external terminal including a lead base material constituted of a predetermined metal material, and a metal thin film covering a surface of said lead base material,*

*wherein said metal thin film has a first layer made of a material substantially Pb-free;*

*wherein said first layer is made of a material predominantly composed of tin;*

*wherein an average value of a crystal size index of a crystal particle constituting said first layer is greater than or equal to 7 μm,*

*wherein said crystal size index defines a value obtained by dividing a sum of a size in a first direction and a size in a second direction by 2, in said crystal particle seen in a cross section of said first layer;*

*wherein said cross section of said first layer is a given surface cutting said first layer in said first direction;*

*wherein said first direction is a direction, which is perpendicular to said surface of said lead base material;*

*wherein said second direction is a direction, which is parallel to said surface of said lead base material;*

*wherein said first layer is composed of a plurality of crystal particles arranged in a single layer on said surface of said lead base material; and*

*wherein said average value of said crystal size index is obtained by continuously arranged crystal particles more than or equal to 5 particles.*

*46. An electronic component, comprising:*

*an external terminal including a lead base material constituted of a predetermined metal material, and a metal thin film covering a surface of said lead base material,*

*wherein said metal thin film has a first layer made of a material substantially Pb-free;*

*wherein said first layer is made of a material predominantly composed of tin;*

*wherein an average value of Xh/Xv of a crystal particle constituting said first layer is greater than or equal to 4,*

*wherein Xv is a size in a first direction perpendicular to said surface of said lead base material, in said crystal particle seen in a cross section of said first layer;*

*wherein Xh is a size in a second direction parallel to said surface of said lead base material, in said crystal particle seen in said cross section of said first layer;*

*wherein said cross section of said first layer is a given surface cutting said first layer in said first direction;*

*wherein said first layer is composed of a plurality of crystal particles arranged in a single layer on said surface of said lead base material; and*

*wherein said average value of said crystal size index is obtained by continuously arranged crystal particles more than or equal to 5 particles.*

*47. The electronic component as recited in claim 17, wherein a thickness of said single layer is defined by a thickness of each of said crystal particles.*

*48. The electronic component as recited in claim 18, wherein a thickness of said single layer is defined by a thickness of each of said crystal particles.*

*49. The electronic component as recited in claim 19, wherein a thickness of said single layer is defined by a thickness of each of said crystal particles.*

*50. The method as recited in claim 20, wherein a thickness of said single layer is defined by a thickness of each of said crystal particles.*

*51. The electronic component as recited in claim 31, wherein a thickness of said single layer is defined by a thickness of each of said crystal particles.*

*52. The electronic component as recited in claim 32, wherein a thickness of said single layer is defined by a thickness of each of said crystal particles.*

*53. The electronic component as recited in claim 33, wherein a thickness of said single layer is defined by a thickness of each of said crystal particles.*

*54. The method as recited in claim 34, wherein a thickness of said single layer is defined by a thickness of each of said crystal particles.*

*55. The electronic component as recited in claim 39, wherein a thickness of said single layer is defined by a thickness of each of said crystal particles.*

*56. The electronic component as recited in claim 40, wherein a thickness of said single layer is defined by a thickness of each of said crystal particles.*

*57. The electronic component as recited in claim 41, wherein a thickness of said single layer is defined by a thickness of each of said crystal particles.*

*58. The method as recited in claim 42, wherein a thickness of said single layer is defined by a thickness of each of said crystal particles.*

*59. The electronic component as recited in claim 43, wherein a thickness of said single layer is defined by a thickness of each of said crystal particles.*

*60. The electronic component as recited in claim 44, wherein a thickness of said single layer is defined by a thickness of each of said crystal particles.*

*61. The electronic component as recited in claim 45, wherein a thickness of said single layer is defined by a thickness of each of said crystal particles.*

*62. The electronic component as recited in claim 46, wherein a thickness of said single layer is defined by a thickness of each of said crystal particles.*

* * * * *